US007315662B2

(12) United States Patent
Hunt et al.

(10) Patent No.: US 7,315,662 B2
(45) Date of Patent: Jan. 1, 2008

(54) ELECTRONIC AND OPTICAL DEVICES AND METHODS OF FORMING THESE DEVICES

(75) Inventors: Andrew T. Hunt, Atlanta, GA (US); Robert E. Schwerzel, Alpharetta, GA (US); Yongdong Jiang, Atlanta, GA (US); Zhiyong Zhao, Atlanta, GA (US); Todd Polley, Atlanta, GA (US)

(73) Assignee: n Gimat Co., Atlanta, GA (US)

( * ) Notice: Subject to any disclaimer, the term of this patent is extended or adjusted under 35 U.S.C. 154(b) by 0 days.

(21) Appl. No.: 11/444,542

(22) Filed: Jun. 2, 2006

(65) Prior Publication Data

US 2006/0228064 A1 Oct. 12, 2006

Related U.S. Application Data

(62) Division of application No. 10/362,435, filed as application No. PCT/US01/26491 on Aug. 24, 2001, now Pat. No. 7,145,412.

(60) Provisional application No. 60/227,838, filed on Aug. 25, 2000.

(51) Int. Cl.
*G02F 1/035* (2006.01)

(52) U.S. Cl. .......................................... 385/2; 385/40

(58) Field of Classification Search .................... 385/2, 385/8, 40

See application file for complete search history.

(56) References Cited

U.S. PATENT DOCUMENTS

| | | | | |
|---|---|---|---|---|
| 3,980,395 | A * | 9/1976 | Giallorenzi et al. | 349/196 |
| 5,270,298 | A | 12/1993 | Ramesh | |
| 5,721,194 | A | 2/1998 | Yandrofski et al. | |
| 5,852,688 | A | 12/1998 | Brinkman et al. | |
| 6,097,263 | A | 8/2000 | Mueller et al. | |
| 2002/0013006 | A1 | 1/2002 | Miki et al. | |
| 2002/0097362 | A1* | 7/2002 | Yamada et al. | 349/130 |

FOREIGN PATENT DOCUMENTS

JP 11-284211 10/1999

OTHER PUBLICATIONS

A.V. Rao, S.A. Mansour, A.L. Bement, Jr., Materials Letters 29, (1996) 255-258.

* cited by examiner

*Primary Examiner*—Sarah Song

(57) ABSTRACT

Electronic and optical (or photonic) devices with variable or switchable properties and methods used to form these devices, are disclosed. More specifically, the present invention involves forming layers of conductive material and dielectric material or materials with varying conductivity and indexes of refraction to form various electronic and optical devices. One such layer of adjustable material is formed by depositing epitaxial or reduced grain boundary barium strontium titanate on the C-plane of sapphire.

8 Claims, 6 Drawing Sheets

ELECTRONIC AND OPTICAL DEVICES AND METHODS OF FORMING THESE DEVICES

This application is a divisional of U.S. application Ser. No. 10/362,435 filed on Jul. 24, 2003, now U.S. Pat. No. 7,145,412, which is the U.S. National phase of PCT/US01/26491 filed Aug. 24, 2001 and which claims priority from U.S. Application No. 60/227,838 filed Aug. 25, 2000.

BACKGROUND OF THE INVENTION

The present invention is directed to electronic and optical (or photonic) devices with variable or switchable properties and methods used to form these devices. More specifically, the present invention involves forming layers of conductive material and dielectric material or materials with varying conductivity and indexes of refraction to form various electronic and optical devices.

Thin films (and thick films in some cases) are useful for forming many different electronic and optical devices. Capacitors (and other devices such as phase shifters) are formed by depositing dielectric material and conductive material layers, the conductive layer(s) forming the electrodes of the capacitor. In optical devices, films of material having relatively high indexes of refraction are deposited adjacent to films of materials having relatively low indexes of refraction to form wave-guides, filters, lenses and other devices. Many materials are useful for forming both the dielectric material as well as the materials having high indexes of refraction.

Also, in the fields of electronics, RF and photonics, the use of electrically active materials is becoming more and more popular. Electrically active materials are those materials that have a particular parameter that can be changed by applying an electric field through the material. This parameter may be optical such as the index of refraction of the material (electrooptic, E-O, materials), or may be electrical such as the dielectric constant (ferro (or para) electric). As these two parameters are associated, some materials are both ferroelectric and electrooptic.

The class of dielectric materials that possess the property that their permittivity (dielectric constant—DK) changes under the application of a DC or slowly varying electric field are commonly referred to as "ferroelectrics" (f-e) if the material is designed to operate below the material's Curie temperature or point, or "paraelectrics" (p-e) if the material is designed to operate above its Curie point. For simplicity, they will be called ferroelectrics (f-e) in this disclosure, and it will be understood to apply to either f-e or p-e materials. Of particular interest for microwave device applications is the paraelectric range of a material, i.e., where the material is above its Curie temperature. In the paraelectric region the variation in capacitance of the material is substantially linear with respect to applied bias voltage. Barium strontium titanate having the formula $Ba_xSr_{1-x}TiO_3$ (BST) is a highly studied material with great potential in these applications. BST is used herein to refer to material having the formula $Ba_xSr_{1-x}TiO_3$ where x equals 0, equals 1, or x is greater than 0 and less than 1. For $SrTiO_3$ (x equals 0) the Curie temperature is very low, and this material is in the paraelectric range at cryogenic temperatures. For $BaTiO_3$ (x equals 1) the Curie temperature is high. Generally an intermediate Curie temperature is desired; thus for most applications, the molar ratio of Ba:Sr is between 10:90 and 90:10, particularly between 30:70 and 70:30, more particularly between 60:40 and 40:60. The choice of Ba:Sr, and thereby the selection of Curie temperature, is thus selected according to the anticipated operating temperature of the device. For devices intended to be operated in a range encompassing room temperature, a Ba:Sr molar ratio of between 60:40 and 40:60 is preferred. Mixed oxides, such as BST where x is greater than 0 and less than 1 are harder to deposit than single cation oxides, such as when x is 0 or 1. This difficulty is primarily compositional control. The combustion chemical vapor deposition process, as described for example, in U.S. Pat. No. 5,652,021, the teachings of which are incorporated herein by reference, allows the use of a single precursor solution containing precursors for all cations. A single solution significantly aids in compositional control, although it is important to maintain other depositional parameters, such as temperature, pressure, gas flow rates, etc. in order to maintain compositional control even in a CCVD process. Preferably, in a mixed BST, the ratio of B/S does not vary spatially more than about 5%, preferably no more than about 1% during the deposition of a layer.

Electrical, radio frequency (RF), or microwave applications of these electrically active materials include such general classifications as varactor diode replacement, capacitors, tunable capacitors, tunable filters, phase shifters, multiplexers (to include duplexers), voltage controlled oscillators, tunable matching networks for power amplifiers (PA's), low noise amplifiers (LNA's), thermoelectric effects including power systems, and general impedance matching networks.

The tunable characteristic of f-e materials can be exploited in the design of components, subsystems and/or systems in mobile communication systems to achieve:

1) new capability and improved electrical (RF or microwave) performance from 300 MHz to ~30 GHz
2) smaller size,
3) lower power consumption,
4) less weight, or any combination of these four items as determined by specific system design requirements.

There are numerous ceramic materials that can be used as f-e thin or thick films. Thin films tend to be used in smaller devices than thick films; thin films are generally deposited to a thickness up to 10 microns, while thick films are typically above 10 microns.

Wireless handsets are characterized by their need for low voltage operation, typically <40 VDC, and ideally <3.0 VDC. It is expected that this voltage will decrease further in future designs. Thus, any f-e tunable device must be able to be designed in such a way as to create appropriate electric fields from a small DC tuning voltage. One way to achieve a suitable geometry is to design variable capacitors consisting of thin films of f-e materials. The small DC tuning voltage also results in reduced power consumption (and heat dissipated) from RF and E-O devices.

Tunable capacitors allow for the f-e material to be localized to a small part and allows for the use of the small geometries needed to create electric fields of sufficient magnitude necessary for tuning from small voltages. For the design of tunable filters and multiplexers in the frequency range of >800 MHz (the cellular band), small valued capacitors are required so that the rf signal is not reduced if the variable capacitor is used in such a way as to shunt a resonant structure for tuning purposes.

As previously described, related to the variation in capacitance of these materials with applied bias voltage is the electrooptic phenomena of variation of refractive index with applied bias voltage. Photonic applications of these materials are in phase modulators and active waveguides that have functions such as switch, split, attenuate, compensate or combine.

Barium Strontium Titanate (BST) is a useful material for the above applications. BST is also used herein to refer to doped material wherein an additional element(s), such as lead, replaces some of (usually less than 15%, and more commonly less than 10%, but even up to 50%) of the Barium or Strontium in the crystal lattice. Alternatively, elements such as tungsten, aluminum, magnesium, calcium and others can be used to modify the properties of the BST by replacing some of the Titanium in the lattice. Such dopants may improve the Q factor of the BST. As Ba and Sr have +2 valences, typical valences also have +2 valences. However, combinations of +3,+3, and/or +1/+5 valence doping ion combinations may be used. Cations of valence other then +2 may be used by themselves in BST with vacancies in the lattice structure. Cesium and Bismuth are such dopants. BST is a recognized ferroelectric and $BaTiO_3$ is a known E-O material for the applications described above. BST can be doped by most metallic elements.

To eliminate grain boundaries that create loss in both optical and electrical devices, epitaxial f-e materials are highly preferred to polycrystalline f-e materials. Heretofore, the most common substrate material for epitaxial BST deposition has been magnesium oxide and lanthanum aluminum oxide, materials which have crystal lattice structures which match that of BST. A significant drawback of both magnesium oxide and lanthanum aluminum oxide is that they are currently available only in very small wafer sizes. Furthermore, these small wafers are very expensive to produce. They also tend to exhibit poor crystallinity and poor surface roughness.

There are implicitly huge benefits to be realized from larger wafers. The semiconductor industry is currently moving toward 12 inch square (30 cm. square) wafer sizes so as to realize lower production costs. Similar cost savings can be implicit with ceramic materials available in a larger size for microelectronic device fabrication.

Currently, sapphire is available in 100 mm wafers with some suppliers planning to introduce 150 mm wafers soon. This is significantly larger than available wafer sizes for magnesium oxide and lanthanum aluminum oxide.

Sapphire, single crystal alumina, has recognized benefits over both magnesium oxide and lanthanum aluminum oxide in that it can be produced at lower cost, increased wafer size, excellent crystallinity and minimum surface roughness. However, BST is not an obvious crystal lattice match, and, indeed, attempts to date to deposit epitaxial BST on sapphire have not met with success.

For some applications, less than epitaxial quality BST and other materials may be used. Co-pending PCT Application PCT/US01/22131, entitled "REDUCED GRAIN BOUNDARY CRYSTALLINE THIN FILMS", filed 13 Jul. 2001, describes methods of forming reduced grain boundary (RGB) thin films that are useful in forming some of the devices of the present application. For applications that require highly epitaxial films, reference should also be made to Co-pending PCT Application PCT/US01/24587, entitled "ELECTRONIC AND OPTICAL MATERIALS", filed 2 Aug. 2001, which discloses methods for producing epitaxial thin films useful in forming the devices of the present invention. It should also be noted that some of the thin films in the devices of the present invention may still operate adequately in polycrystalline or even amorphous form.

SUMMARY OF THE INVENTION

The present invention involves the formation of optical and electronic devices using thin film technology. In a first aspect of the invention, thin conductive layers are formed on ferroelectric material. When a voltage is applied between these conductive layers, the relative dielectric constant (or index of refraction in electrooptic applications) of the material is changed. This results in a change of capacitance or electromagnetic wave transmission between two main terminals also attached or in close proximity to the variable material. Present technology applies the biasing voltage via the main conductors of the device such as a capacitor, phase shifter, filter or resonator. The device conductors are used versus adding additional conductors to apply the bias because additional traditional conductors would affect the device performance. To reduce the required bias voltages, the conductors must be very close together. This creates a limit due to the dimensional tolerance of manufacturing systems for imaging and etching. In addition, the freedom of designability of the radio frequency (RF) or electrooptic (E-O) device is hampered by this need to keep the main conductors very close. Additional designability issues preclude certain pattern due to the enhancement of electric fields (e.g. corners, acute angles) and the potential for premature breakdown. Using the thin films of the present invention allows formation of separate thin film biasing electrodes on the top and bottom of the thin film ferroelectric material. This small separation of the biasing voltage allows a smaller voltage to make a high electric field, thus resulting in a greater change in the dielectric constant for a given biasing voltage. An important aspect of the present invention is the ability of the biasing electrodes to have nominal interaction with the RF and microwave signals. These biasing electrodes are referred to as non-RF biasing electrodes in this patent application. It is preferred that the material of the non-RF biasing electrodes should not interact with these waves. This is accomplished by having a material in which the resistance is high enough particularly with respect to the high frequency signal. When this resistance is high enough, the biasing electrodes introduce minimal or non-detectable loss when compared to the structure without biasing electrodes. This aspect of the invention allows designers of the structures to separate the main, thicker conductors of the RF signal and provides for the use of low bias voltages. One or both of the biasing electrodes can be nominally RF interacting. Presently, bias voltages of greater than 40 volts, sometimes even greater than 200 volts are needed. The thick highly conductive conductors of the filters, phase shifters, resonators and other designs are needed for strong interaction with the RF and microwaves. The lower the frequency, the thicker the device conductors need to be. The very low loss biasing electrodes of the present invention are separated by the thin film of the tunable material; the variable dielectric. The bias voltage is DC or a low frequency AC voltage which causes the change in the dielectric constant desired. With the electrodes of the present invention, the resulting change in capacitance can be supplied by a less than 40 volt bias and even less than 3 volt, thus enabling direct chip control and eliminating the need for multiple voltages within the product or device. This is in particular important for portable electronic devices and for safety reasons. Also the design of the main electrodes and performance of the device is optimized for the application desired rather than being limited by having to minimize separation of the main electrodes. To provide for reduced interaction with the RF or microwave signal, the materials for the thin biasing electrode can be highly resistive in nature. Their DC resistance is preferred to be between 10?/square and 10M?/square, and more preferably between 100?/square and 1M?/square. It is further desired that at the high frequencies of the RF or microwave signal that these materials have responses of induced higher parallel resistance. In order to reduce loss in a capacitor structure, it is desirable to increase the parallel resistance in the electrodes, thereby shifting more of the RF or microwave electric field into the dielectric layer as the dielectric layer presents a lower impedance to the signal than the resistive biasing electrodes. It is even further desired that the material of the electrodes have a high frequency resistance of increased parallel resistance when compared to similar resistances of normal metal conductors, with increases of 25%, 100%, even 200% over normal metal conductors.

It is further desired that these materials have fast response times to enable high speed devices. The lower the DC resistance the faster the bias voltage affects the variable dielectric which results in faster response time. In addition, the shorter the length of any higher resistance material, the faster the response time. Using these aspects as design parameters, results in the new structures of the present invention, as described below.

Very thin layers of various materials can meet this objective. Also, materials which are mixed conductors, that is electronic and ionic, or more likely ionic or semi-conducting, thus aiding in the modulation of further resistance at higher frequencies while still allowing enough conductivity at low frequencies or DC voltages to enable biasing of the ferroelectric materials while minimizing the effect on the performance of the device. Conductors have distinct amounts of carriers and mobilities. The carriers can be electrons, holes or a mixture thereof. Of benefit to this application, is reduced mobilities, in particular at the desired use frequency. A larger proportion of hole conductors can also benefit the RF/DC differential.

Any loss that is caused by the biasing electrodes is offset by the benefit to the system wherein the use of higher voltages as well as enabling the optimal, functional, device design including conductor separation. The materials of the biasing electrodes can be grown as a base layer (potentially epitaxial) prior to the variable dielectric material or they can be grown on top of the dielectric material or otherwise deposited thereon to form the system. To further minimize loss, the material can be discontinuous in design, so it is not a full sheet but has fine lines in various patterns. To further minimize the interaction with the wave propagation between the electrodes, the biasing electrodes can be formed as strips that are diagonal to the main electrodes (system lines), parallel to the system lines, or perpendicular to the system lines. The top and bottom bias strips can be directly across the thin film, or alternating. Alternating the bias strips will minimize leakage and can better align dielectric changes with some devices, but this can also slightly increase the bias voltage needed. The highly conductive main electrode device lines can be on one surface of the dielectric material film, with the bias voltage being applied between a main electrode that is electrically connected to one of the bias electrodes, and the biasing electrode on the other side of this thin film variable dielectric material. Alternatively, one device line can be contacting and used to apply the potential to one bias electrode and another device line can contact and be used to apply the potential to the other bias electrode thereby applying the net potential across the variable dielectric. Using the highly conductive device lines to apply the potential to shorter, more resistive bias electrodes will increase the speed of change in the variable dielectric, resulting in faster device speeds. The non-RF bias electrodes can also be deposited on only one surface and be formed as interdigital electrodes.

To further illustrate the advantage of the biasing electrodes of the present invention, we should consider the previous method of reducing the required tuning voltage for prior art tunable capacitors, wherein it is often necessary to reduce the gap between electrodes to very small values, so small voltages can result in large electric fields. However, this method of providing low voltage tuning, can induce distortions in the RF signal. For example, a critical problem for systems based on tunable capacitors is intermodulation distortion. The phenomenon of intermodulation distortion occurs when the amplitude of the RF signal is sufficiently high that the RF voltage itself can affect the value of the tunable capacitor itself. This induced nonlinearity can cause distortion of the RF signal.

In the present invention, the phenomenon of intermodulation distortion is addressed by increasing the gap between the RF electrodes, thereby reducing the intensity of the RF-induced fields in the ferroelectric materials, and maintaining the dielectric constant of the materials approximately invariant to RF field strength. However, the DC tuning voltage is maintained low by extending highly resistive protrusions of material into the space between the RF electrodes. These protrusions are preferentially electrically connected to the RF electrodes themselves. Since the ferroelectric material presents a low-impedance path to the RF signals, the highly resistive protrusions will not significantly change the RF impedance of the overall structure. However, if a DC bias is applied to the RF electrodes in addition to the RF signal, the ferroelectric material will present a high impedance path to the DC signal, ideally forcing the protrusions to charge up to the DC voltage. If the spacing between the protrusions is small, this DC voltage will result in high electric field intensities in the ferroelectric material, and thereby effect tuning at low applied DC voltages. Since the value of the variable capacitor taught herein is independent of the intensity of the RF signal, while simultaneously is sensitive to small values of DC voltage, the problem of intermodulation distortion is greatly reduced.

In another aspect of the present invention, electrooptic or high index of refraction materials are deposited between two layers of material having lower indexes of refraction to form waveguides or optical filters. When the high index of refraction material is also electrooptic, the waveguide is steerable and the optical filter is tunable. In the steerable/controllable waveguide application, the use of the thin films of the present invention allows for preferable use of conductive oxides to act as the biasing electrodes, thereby eliminating the need for a cladding buffer layer and increasing the effectiveness of the waveguide. The use of TCOs together with electrooptical material allows the formation of a stack of high index of refraction and low index of refraction materials that can be tuned to allow modulation, switching, actuation, polarization or transmission of a particular wavelength of light. In this manner, the biasing voltage can be adjusted to control a number of aspects of the light.

In the case of photonics, the electrodes can be materials that might actually couple strongly with the light (if thick). For instance, metals and doped metals can be used, if thin enough to have only enough conductivity to enable biasing, but too thin to interact with the light. Semiconductors can also be used in many cases, as some of these materials are opaque in the visible range but transparent at infrared (IR)

wavelengths. Silicon is one example of such a material that can be used as the dielectric in an optical stack type of filter described below. Other materials can be used as well, such as semiconductors, hole conductors, ionic conductors or mixed conductors. The objective of using these materials being to free the overall design to beyond transparent conductive oxides, TCOs and thereby enable materials that might be more compatible or easier to produce in the overall stack. The stack, preferably, having reduced or no grain boundaries. Furthermore, these materials can be more readily post processed or easier to manage in the deposition process.

Materials that have a larger variation in index of refraction such as plain silica for a low index material, can have added benefits. The materials next to the variable dielectric can be internally reflecting or transmitting layers. The bias voltage could be such that at some locations the adjacent materials cause the light to transform from internally reflecting to transmitting due to an index of refraction change in the material, thereby enabling a gate to open for the photons to pass through the waveguide device.

As previously mentioned, a particularly useful material for these applications is BST. Herein, epitaxial BST is deposited on the C-plane of sapphire. Though C-plane is not an obvious lattice match, an aspect of this invention is epitaxial deposition of BST on the C-plane, which has proven successful. C-plane sapphire retains advantages described above with respect to magnesium oxide and lanthanum aluminum oxide.

While BST has one of the better variable dielectric values, other variable dielectric materials and electrooptic materials can be used including PLZT (lead lanthanum zirconium titanate) $LiN_6O$, ZnO and PZT (Pb/Zr/Ti oxide) as well as any of the other materials that demonstrate a change in dielectric upon biasing. The actual material used as the active material of the device is not a limiting factor within the scope of this invention. Generally the materials to which the invention is most applicable have perovskite structures. Preferred perovskites according to the invention have a cubic structure. Generally perovskites useful in the invention have the formula $A^{+x}B^{+(6-x)}O_3$ where A and B are cations or mixtures of cations and 1=x=3.

As previously noted, transparent conductive oxide (TCO) thin films can be used as the conductive layers in either RF or photonic applications. TCOs may be formed by a combustion chemical vapor deposition (CCVD) process in which the deposited material is zinc oxide that is doped by elements selected from the group consisting of gallium, aluminum, tin, indium, boron, fluorine, and mixtures thereof. The elements enhance the electrical properties of the zinc oxide thin films. Preferred CCVD precursor solutions comprise zinc oxide precursor and dopant(s) precursor(s) dissolved in an ethanol-based solvent system containing between about 1 and about 10 vol. % dimethyl formamide. These TCO thin films have use in other devices, such as conductive layers in a solar cell.

DETAILED DESCRIPTION OF CERTAIN PREFERRED EMBODIMENTS

Figure 1:
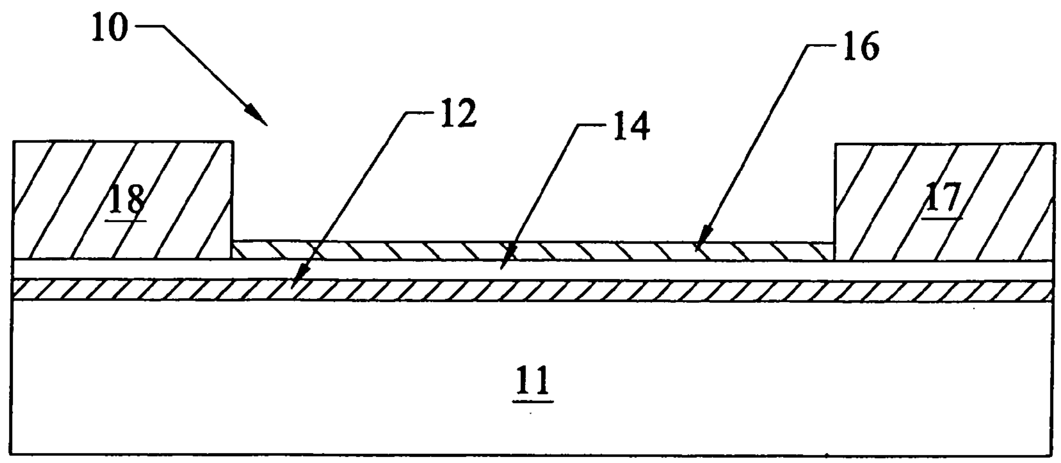
FIG. 1 shows a cross sectional view of an electrically adjustable capacitor formed of the thin films of the present invention.

In FIG. 1, an electrically adjustable capacitor 10 is shown in cross section. A supporting substrate 11, has a first biasing electrode 12 deposited thereon. A ferroelectric layer 14 is deposited on top of electrode 12. A second biasing electrode 16 is deposited on top of ferroelectric layer 14. The highly conductive lines that act as the RF capacitor terminals, filters or strip lines of the device are shown as 17 and 18. It should be understood that FIG. 1 is a conceptual partial cross section and lines 17 and 18 can be in the form of fingers (50 or more) to thereby form the terminals of an interdigital capacitor (should the device be used as a capacitor). This particular aspect of the lines changes depending on the application, and many possible configurations can be used within the scope of the present invention.

The biasing electrodes 12 and 16 are extremely thin on the order of 200 nm to 0.1 nm, more preferably 50 nm to 0.4 nm, and most preferably 5 nm to 0.5 nm. The thin nature of these electrodes allows biasing of the ferroelectric layer 14, without or with minimal interference with the RF or microwave signal existing between terminals 17 and 18. This is due to the fact that these thin films are much thinner than the electromagnetic skin depth of the RF or microwave signal, or may be constructed of a material that is conductive at DC or low frequency, yet a dielectric at high frequency or transparent at optical wavelengths. In addition, the conductivity of these layers can be relatively low, as long as they are conductive enough to produce the required electric field through the ferroelectric material layer 14. To this end, the layers do need to be at least conductive enough (thick enough) to enable biasing. The conductive layers 12 and 16 may be of conductive oxides, such as tin oxide, zinc oxide, and indium tin oxide or may be any electrically semiconductive or conductive metal or material with charge carriers that are holes or electrons.

The thickness of the dielectric layer 14 is in the range of 0.1 to 10 microns, preferably 0.2 to 3 microns and more preferably 0.3 to 1.5 microns. Suitable ferroelectric materials for this layer include zinc oxide, barium strontium titanate (BST), Pb/La/Zr/Ti oxide (PLZT), and lithium niobate.

The substrate 11 can be a material which has a surface crystalline structure that provides a lattice match or near lattice match for the material of the layers to be grown on top. The substrate does not have to be single crystal to provide substantial benefit. Any large grained or oriented grained substrate from which the dielectric layer can grow with strong crystallinity and reduced grain boundaries, is significantly beneficial to the electrical and/or optical properties of the device. By reduced grain boundary layers is meant herein at least columnar, i.e., well defined grains extending from the bottom to the top of the layer, also know as Type II structure. Preferably, the grains are equiaxed or Type III structure having at least a 1:1 width to height ratio. Higher width to height ratios are even more desirable. A 5:1 width to height ratio is preferred. More preferred are ratios of 10:1, 20:1 and even higher up to and including epitaxial. In effect, the deposited material grown has some, and may be multiple, epitaxial relationships to each substrate grain depending on the orientation of the grain and the lattice of the grain's surface. As such, polycrystalline substrates of magnesium, alumina or other desirable RF substrates can be used if large crystals. Similarly, conductive metals such as nickel, silver and gold can be used. The key is increased crystallinity. Textured metal, particularly cubic structured metals such as nickel, silver and gold, may serve as a substrate for epitaxial growth of thin films. Single crystal material which may serve as substrates for epitaxial growth include magnesium oxide (MgO), sapphire (single crystal alumina), and lanthanum aluminate. Also, the substrate could be coated with a highly crystalline, biaxial to single crystal layer of any material onto which an electrode material and the ferroelectric material can be grown. Some examples are a Silicon wafer with an epitaxy layer of Tin Oxide or Ceria and materials such as YSZ or MgO grown via ion beam assisted deposition (IBAD) which yields a strongly textured to single crystal layer on a wide range of substrates including glass. Alternative to epitaxial deposition, substrate 11 may be any material that provides a support layer for the conductive and dielectric thin films, without a particular texture or lattice if non-epitaxial materials are used for the dielectric and/or conductive layers. The original deposition substrate may be a permanent part of the structure 10, or may be removed (by techniques known in the art such as selective etching or delamination) after the thin films 12, 14 and 16, terminals 17 and 18 and any other upper support layers (not shown) have been formed or attached. Furthermore, if the original deposition substrate is for some reason not the preferred final support substrate 11 (for example a textured metal that would interfere with the electrical signal), the original substrate may be removed, and the deposited layers can be adhered or laminated to the final substrate. Another alternative method of deposition involves a different method of forming conductive layer 12, which involves deposition of the ferroelectric layer 14 directly on substrate 11 (this may be necessary for epitaxial growth). After the upper layers are formed, the substrate 11 is then removed, and layer 12 is deposited on the ferroelectric layer 14. By depositing layer 12 after formation of the variable layer, layer 12 does not have to enable highly crystalline or reduced grain boundary growth of the ferroelectric layer 14.

Figure 6:
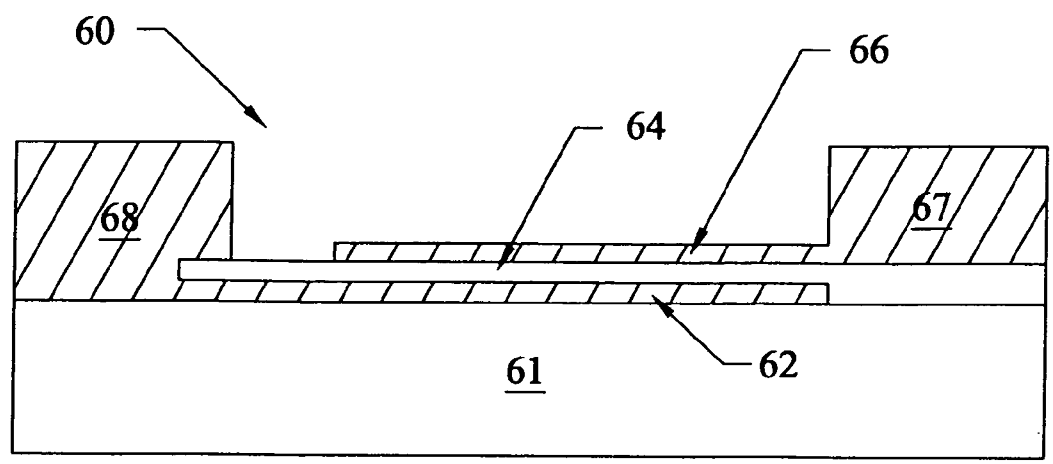
FIG. 6 shows a cross sectional view of another embodiment of the electrically adjustable capacitor of FIG. 1.
Figure 7:
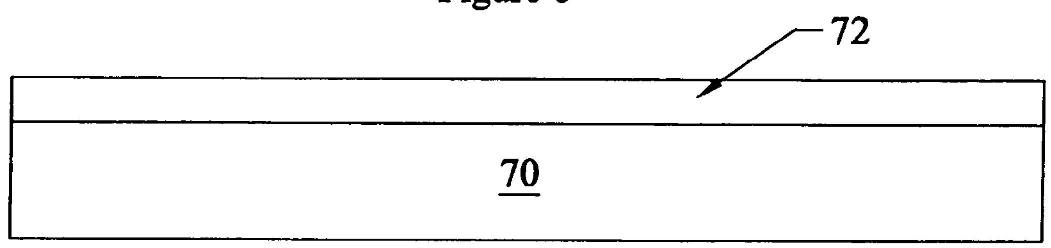
FIGS. 7-12 show the steps in forming dielectric and electrode structures on a substrate, in accordance with a method of the present invention for forming electronic and optical devices.
Figure 8:
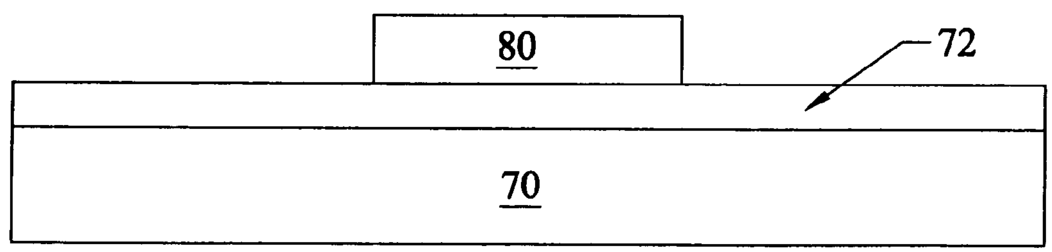
Figure 9:
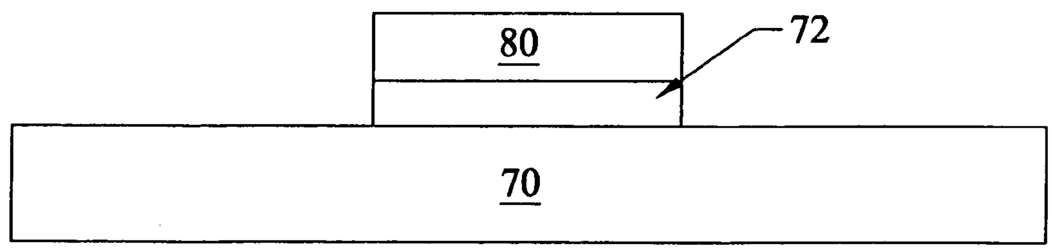

FIG. 6 illustrates a further embodiment 60 of the device in FIG. 1. In this embodiment, a supporting substrate 61, has a first biasing electrode 62 deposited thereon, with a ferroelectric layer 64 deposited on top of electrode 62. The second biasing electrode 66 is deposited on top of ferroelectric layer 64. The highly conductive lines that act as the RF capacitor terminals, filters or strip lines of the device are shown as 67 and 68. In this embodiment, the highly conductive lines 67 and 68 are electrically connected to electrodes 67 and 62, respectively.

As with the previous embodiment, the biasing electrodes 62 and 66 are extremely thin on the order of 200 nm to 0.1 nm. The thin nature of these electrodes allows biasing of the ferroelectric layer 64, without or with minimal interference with the RF or microwave signal existing between terminals 67 and 68. In addition, the conductivity of these layers can be relatively low, as long as they are conductive enough to produce the required electric field through the ferroelectric material layer 14. To this end, the layers do need to be at least conductive enough (thick enough) to enable biasing. The conductive layers 62 and 66 may be of conductive oxides, such as tin oxide, zinc oxide, and indium tin oxide or may be any electrically semi-conductive or conductive metal or material with charge carriers that are holes or electrons.

Zinc oxide (ZnO) is a promising conductive oxide for conductive thin films in these devices as well as in solar cells. Herein it is found that the electrical conductivity of zinc oxide thin films can be enhanced significantly by doping with elements such as gallium, aluminum, tin, indium boron, fluorine and mixtures thereof. The currently preferred dopant is gallium.

A thin layer deposited in accordance with the present invention at a thickness of 0.5 micron preferably has a sheet resistance of about 25 ohms per square or less, more preferably of about 20 ohms per square or less, most preferably of about 15 ohms per square or less. At 0.5 micron the thin layer preferably has a light transmission of at least 80%, more preferably at least 85%. These properties are of importance to photonic applications. RF applications in general desire thinner layers with higher resistance.

Zinc oxides may be efficiently deposited in open atmosphere by CCVD as is described, for example, in U.S. patent application Ser. No. 09/198,954, the teachings of which are incorporated herein by reference. The zinc oxide may be appropriately doped by including precursors of gallium, aluminum, tin, indium, boron, fluorine or mixtures thereof oxides in the CCVD precursor solution. The dopant precursor is provided at levels such that in the deposited thin film, the molar ratio of Zn-to-dopant element is between about 99:1 and about 90:10. Typically, the total concentration of precursor compounds in the solvent is between about 0.01 and about 5 wt %.

It is found that ethanol is an excellent solvent for a precursor solution that contains both a zinc-containing chemical precursor and dopant element-containing chemical precursor. Ethanol has a relatively low boiling point and to raise the boiling point, it is preferred that dimethyl formamide be added at levels between about 1 and about 10 vol. %, preferably 2-5 vol. %, relative to the ethanol. In addition, dimethyl formamide is a strong solvent that helps dissolve the precursor chemicals. Any solvent system that co-dissolves the zinc-containing and precursor-containing chemical is suitable for use in the present invention.

Figure 15:
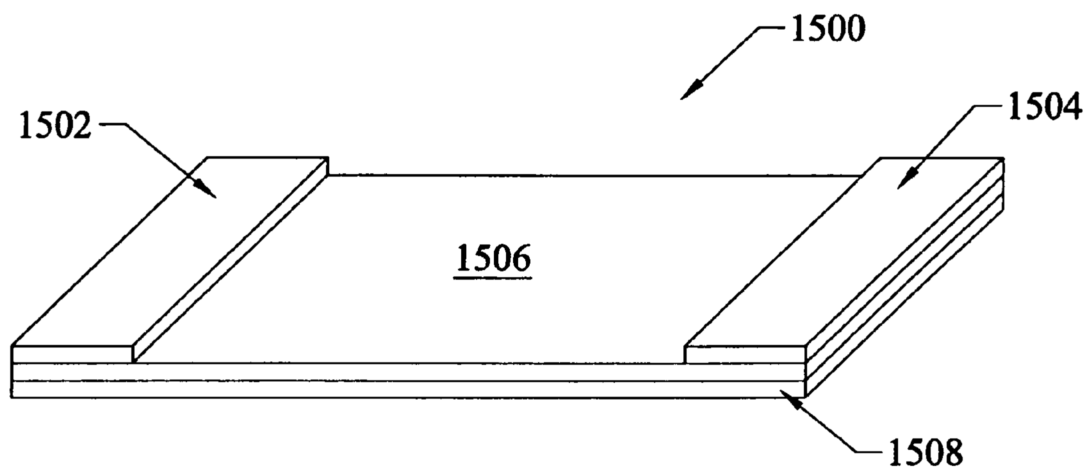
FIG. 15 is an isometric view of a prior art dielectric and electrode structure.

In FIG. 15, a prior art capacitor 1500 is shown. With respect to FIGS. 15-17, it should be understood that these capacitors may have a much larger number of electrode lines (often in an interdigital arrangement), and that the main electrodes of these capacitors have been shown in a simple form for clarity. The two conductive fingers 1502 and 1503, carry both the RF signal, as well as the DC bias that is used to change the dielectric constant of the ferroelectric layer 1506. The ferroelectric layer is shown on top of a substrate 1508.

Figure 16:
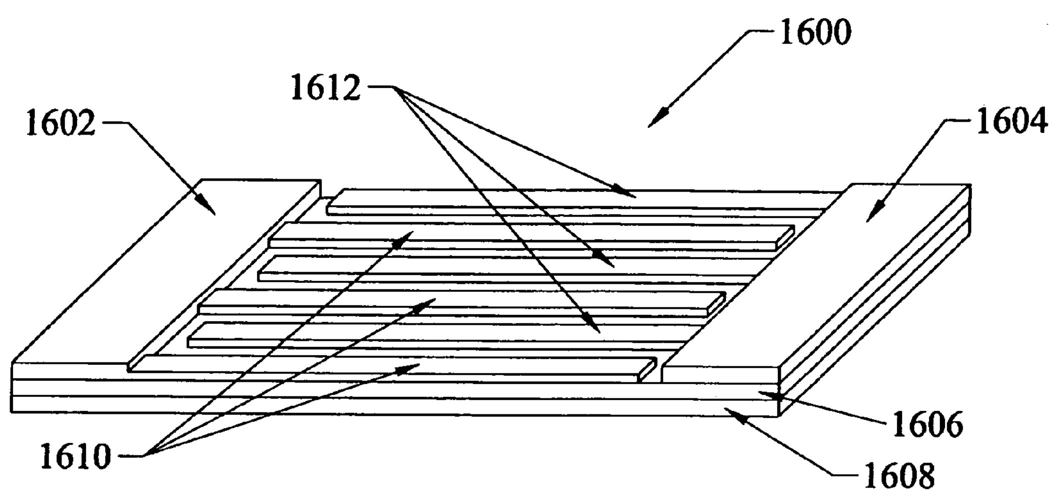
FIG. 16 is an isometric view of a dielectric and electrode structure, showing the thin low-loss electrodes of the present invention.

Turning to FIG. 16, another capacitor 1600 of the present invention is shown. In addition to the thicker RF finger electrodes 1602 and 1604, thinner biasing electrodes 1610 and 1612 are provided. These electrodes 1610 and 1612 are much closer together than the main electrodes 1602 and 1604, thus providing a higher DC electric field through the ferroelectric layer 1606. This higher DC electric field results in a greater change in the dielectric constant for a given DC bias voltage. Because these biasing electrodes are very thin, they have little or no effect on the RF signal. The biasing electrodes 1610 is electrically connected to main electrode 1602, while biasing electrodes 1612 is electrically connected to main electrode 1604. This allows both the RF signal and the DC biasing voltage to be applied to main electrodes 1602 and 1604. As with the prior art capacitor, the ferroelectric layer is shown on top of a substrate 1608.

Figure 17:
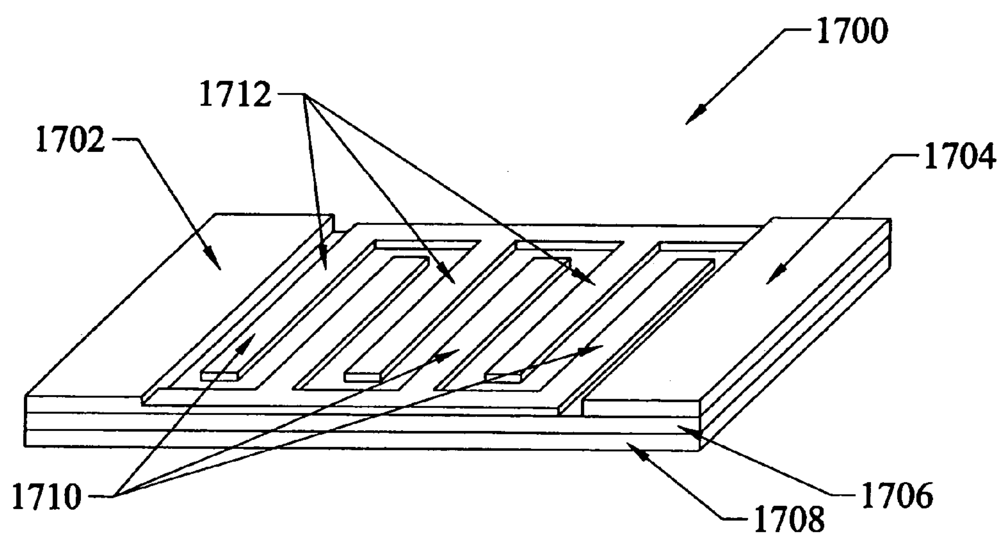
FIG. 17 is an isometric view of another embodiment of the dielectric and electrode structure of the present invention.

In FIG. 17, yet another capacitor architecture 1700 is shown. Capacitor 1700 is similar to capacitor 1600, except that the majority of the biasing electrodes 1710 and 1712 are arranged parallel to the main electrodes 1702 and 1704. In this manner, while the advantage of closer electrodes for a larger DC biasing field is realized, the parallel nature of the electrodes 1710 and 1712 provides less interaction with the RF signal between the main electrodes 1702 and 1704. Ferroelectric layer 1706 is shown on top of substrate 1708.

Figure 2:
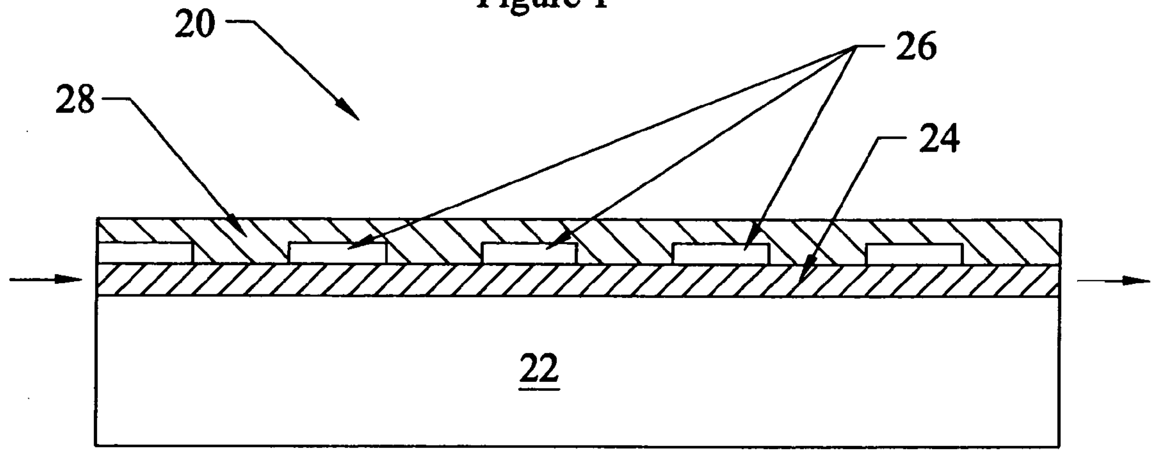
FIG. 2 shows a steerable waveguide formed of the thin films of the present invention.

FIG. 2 illustrates an optical, steerable waveguide 20 that is similar in structure to the capacitor of FIG. 1. A substrate 22 is made of a material having a relatively low index of refraction on its surface to act as a cladding medium. A waveguide layer 24 is grown on top of the substrate 22, and is made of a material having a higher index of refraction. Conductive material having a relatively low index of refraction is then deposited on top of the waveguide layer 24, and is patterned to form biasing electrodes 26 (similar to the finger-type electrodes of an interdigital capacitor). A non-conductive cladding material, also having a low index of refraction, is deposited on top and between the electrodes 26. By sandwiching the waveguide between layers of material having relatively low indexes of refraction, light that enters the left side (for example) of the waveguide will not escape the top and bottom of the waveguide, but will travel down the waveguide and exit at the right side. When a biasing voltage is applied between the electrodes (adjacent fingers having reverse polarity), the index of refraction of the waveguide material is changed in the vicinity of the electrodes, thereby causing a change in the direction (into or out of the page as seen in FIG. 2) of the light traveling through the waveguide. In this manner, light traveling through the waveguide can be "steered" to ports arranged at one end of the waveguide by controlling the biasing voltage applied to the electrodes.

The preferred waveguide material is lithium niobate. Some additional suitable waveguide materials are PLZT (Pb/La/ZrTi oxide), BT, doped ZnO, doped InP, doped GdAs and E-O polymer materials. Epitaxial deposition of PLZT on single crystal MgO by CCVD is described, for example, in U.S. Pat. No. 5,997,956, the teachings of which are incorporated herein by reference. Waveguide layers are generally in the thickness of range from about 0.2 to about 10 microns, typically in the range of about 1 micron. Thicknesses for the biasing electrodes are typically 2000 nm to 0.1 nm thick and preferably 50 nm to 0.5 nm thick (although some applications may require the thicker end of these ranges).

Suitable low refractive index conductive oxides that can be epitaxially grown with the waveguide materials and high refractive index ferroelectric materials described above include tin oxide, zinc oxide, and indium tin oxide. Generally the conductive oxide has a refractive index ranging between about 0.001 and about 0.5 lower than that of the active waveguide material. Alternatively, the electrode material may be very thin so as to minimize the interaction with light, in which case the index of refraction of the electrode is a nominal factor. A wide range of materials can be used including LSC, LSM, RuO, Pt, Ni, doped LaCrO and YBCO.

Both dry etch and wet etch techniques known in the art may be used to pattern these conductive layers to form the biasing electrodes in the waveguide, or in the preferred structure remain as a continuous layer. The fact that the waveguide electrodes can be formed of lower refractive index material than the active waveguide material permits the construction of waveguides with the epitaxial conductive layers in direct contact with the active waveguide layer (as shown in FIG. 2). This is in contrast to prior art devices in which metal electrodes were used, requiring a low refractive index buffer layer to be interposed between the electrodes and the active waveguide layer. With the electrodes in direct contact with the active waveguide material, a higher electric field is formed in the E-O material layer from a set bias voltage, thus improved refractive index biasing is achieved. Electrodes could be on each side of the E-O layer similar to the structure of FIG. 1. All of the discussion of FIG. 1 is thus incorporated for the E-O layer, wherein with respect to FIG. 2, 22 could be an insulative, conductive or semi-conductive substrate that is a lower index of refraction than layer 24 such that there is an effective cladding surface to 22 which enables waveguiding in layer 24. The transparent cladding layer may be insulative, semi-conductive or conductive, or contain a layer of such material. By enabling some transmission of bias voltage closer to layer 24, the required biasing voltage is decreased.

Figure 3:
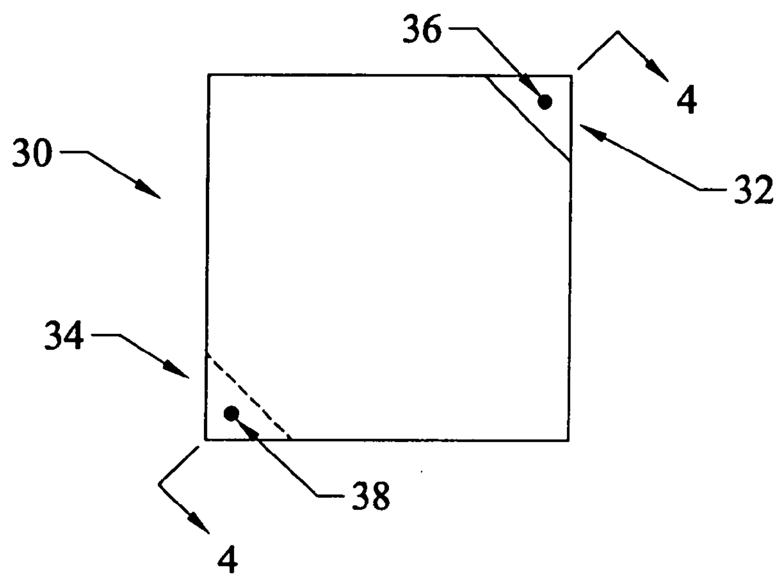
FIG. 3 is a top view of an adjustable optical filter formed of the thin films of the of the present invention.
Figure 4:
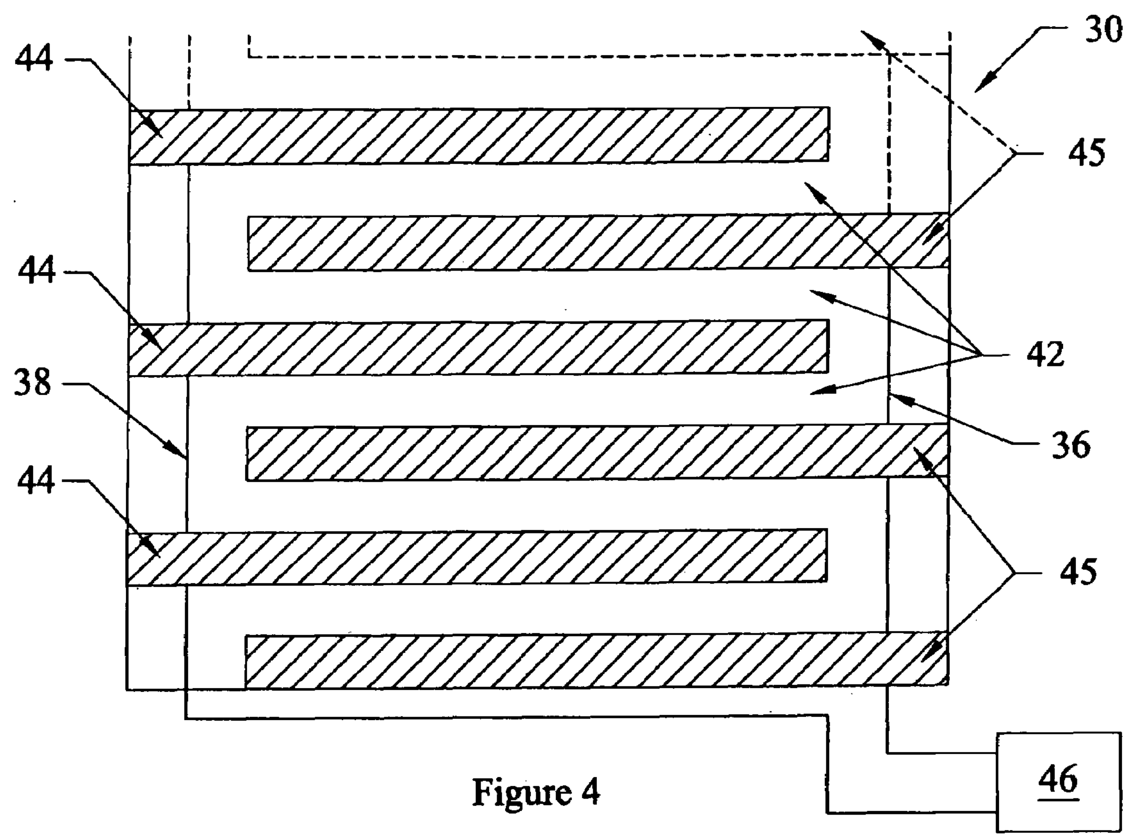
FIG. 4 is a cross sectional view of the adjustable optical filter of FIG. 3 taken through line 4-4.

FIGS. 3 and 4 show a tunable optical filter 30 that can be formed using the thin films of the present invention. Alternating layer of electrooptic material 42 and transparent conductive oxide (TCO) material 44 and 45 are formed by depositing these materials on top of one another. By masking first one corner 32 while depositing every other TCO layer 44, and then masking the opposite corner 34 while depositing the other TCO layers 45, a path is provided for through vias 36 and 38, without shorting out adjacent TCO layers. Because the opposite corners 32, 34 of the TCO layers are alternately masked to prevent deposition of TCO at the corners, if a large number of layers are deposited, the corners could tend to become material deficient and sag. To remedy this, after a TCO layer has been deposited, and the entire surface masked except for the previously-masked corner. Deposition of the high refractive index then only occurs at the corner until the material deficit at the corner is made up. Then the mask is removed and deposition of the high refractive index material continues until the layer 42 of high refractive index electrooptic material is of desired thickness. A voltage source 46 supplies the biasing voltage to the TCO layers. As light enters the top of the filter, reflection and refraction of the light occurs as the light transitions between the layers of high and low relative indexes of refraction. For the wavelength of light that is allowed to pass through the filter, the refracted and reflected waves interfere constructively. By adjusting the voltage applied to the TCO layers, the index of refraction of the electrooptic material is changed, thereby tuning the filter to a different wavelength.

High refractive index ferroelectric materials that can be epitaxially grown include PZT (Pb/Zr/Ti oxide) which may exhibit piezoelectric properties in addition to ferroelectric properties, and barium strontium titanate (BST). When the material also exhibits piezoelectric properties, the thickness of the electrooptic layers 42 is also changed by the applied voltage. This change in thickness also affects the way the refracted and reflected waves interfere, thereby changing the wavelength (and frequency) of light allowed to pass through the filter. To this end, a piezoelectric material with no or nominal E-O behavior can be used to form a tunable filter.

The tunable layers of E-O and piezoelectric materials can comprise only part of the stack. The layers closest to the edge of the filter can be varied while the remaining layers of the filter remain constant (are not varied). It is also possible to have electrodes separately controlled to yield a filter that is tunable in both wavelength (as in FIG. 4) and in filter bandwidth. The width effect for say a band-pass filter would result by incrementally adjusting the bias across each dielectric layer. Another advantage of discrete control of each E-O layer is the ability to compensate for slight thickness variations from ideal in the manufacturing process. By applying a bias voltage to one or more active layers it is possible to compensate for these variations to increase product yield and tolerance.

Waveguide material layers, and selected refractive index material layers of the present invention may need to be grown epitaxially, in which case, each layer is epitaxially grown and serves as a lattice match for the layer grown thereontop. An initial substrate may be used as a support to grow the filter upon, and thereafter is removed using known techniques. In the optical filter, the conductive oxide is selected that has a refractive index lower than the higher index ferroelectric material, typically in the range of from about 1.4 and about 2.0. The layers of the conductive oxide and the layers of higher refractive index ferroelectric material are all about ¼ the wavelength (?/4) of the light being filtered. While TCOs are the preferred material for the conductive layers, it should be noted that materials that are not transparent at larger thicknesses, may be used as the conductive layer if the layer is thin enough to be transparent to the wavelength being filtered, and the remainder of the low index stack can be composed of a non-conductive transparent material. CCVD is known for its ability to form very thin continuous coatings that are suitable to form these ultra-thin layers (on the order of 1-40 nanometers). Alternatively, a uniform thickness E-O or piezoelectric epitaxial or reduced grain boundary layer can be grown with thin electrodes on one or both sides. This coating layer can then be adhered to similar layers with the original substrate being removed from each layer. Each layer is then biased to yield the desired filter.

As previously described, BST is a particularly useful material for both the ferroelectric and electrooptic thin films of the present invention. Deposition of epitaxial BST on single crystal MgO by CCVD is described in PCT application WO 00/42621, the teachings of which are incorporated herein by reference. Epitaxial BST may also be grown by CCVD on c-plane sapphire, as described herein.

The preferred deposition method for epitaxial BST deposition is combustion chemical vapor deposition (CCVD) which is described in U.S. Pat. No. 5,652,021, the teachings of which are incorporated herein by reference. However, it is contemplated that other deposition techniques, such as conventional chemical vapor deposition (CVD), sol-gel and physical vapor deposition (PVD) techniques can be used to deposit epitaxial thin films up to 2000 nanometers thick. Improved deposition techniques may be expected to increase the maximum thickness beyond this thickness. The theoretical minimal thickness for BST films is a molecular monolayer; thus the minimal thickness determined by the molecular size. As a practical matter, to ensure a continuous layer, the thickness of the deposited layer is generally at least about 5 nanometers thick. Currently, most deposits of epitaxial BST are between about 25 and about 1000 nanometers thick.

When BST is deposited by CCVD on c-plane sapphire, deposition is epitaxial, at least in localized regions. Crystalline lattice is substantially 1,1,1.

Some of the Chemical precursors useful in CCVD for deposition of barium, strontium, and titanium are:

Ba barium 2-ethylhexanoate, barium nitrate, barium acetylacetonate hydrate, bis(2,2,6,6-tetramethyl-3,5-heptanedionato)barium hydrate Sr strontium nitrate, strontium 2-ethylhexanoate, bis(2,2,6,6-tetramethyl-3,5-heptanedionato)strontium hydrate Ti titanium (IV) iso-propoxide, titanium (IV) acetylacetonate, titanium (di-iso-propoxide)bis(acetylacetonate), titanium (IV) n-butoxide, titanium (IV) 2-ethylhexoxide, titanium (IV) oxide bis(acetylacetonate)

Stoichiometry of the mixture of precursor chemicals, i.e., a Ba-containing precursor, a Sr-containing precursor, and a Ti-containing precursor, all mixed together as a solution in an appropriate solvent, e.g., toluene, propane, or a toluene/propane mixture, determines the stoichiometry of the BST that is produced. The stoichiometry of the epitaxial layer which may be produced does not necessarily correspond exactly to the stoichiometry of the precursor solution; however, the stoichiometry of the precursor solution required to deposit a layer of desired stoichiometry in the epitaxial layer may be empirically and predictably determined. Because CCVD is a combustion process that relies on combustion of the precursor chemicals, the oxygen component of BST compounds is implicitly available in the process. If other vapor deposition processes were used, oxygen would have to be supplied.

Characteristics of the BST may be altered by appropriate dopants. Of particularly interest are elements which replace barium, strontium or titanium in the crystal lattice structure. The preferred elements include lead, cesium, tantalum, calcium, tungsten and manganese. Additional elements that may be used include lithium, sodium, potassium, rubidium, magnesium, scandium, yttrium, zirconium, hafnium, vanadium, niobium, chromium, molybdenum, technetium, iron, ruthenium, cobalt, rhodium, iridium, nickel, palladium, copper, silver, zinc, cadmium, mercury, aluminum, gallium, indium, thallium, germanium, tin, antimony, bismuth and iodine.

The ferroelectric effect in BST films is changed by substitution of dopants which replace a minor portion of an ion with an ion or ions different in size to slightly change the lattice structure and/or charge. Such an ion(s) replace between about 0.1 and about 5% of the barium ions. $Cs^+$ is slightly larger than the barium ion and is one such ion that could be used to replace barium. Because Ba has a valence of +2 vs. Cs of +1, $Cs^+$ can be used in equal molar ratio with a charge balancing ion, $Ba^{+3}$ being a preferred charge-balancing ion.

Figure 10:
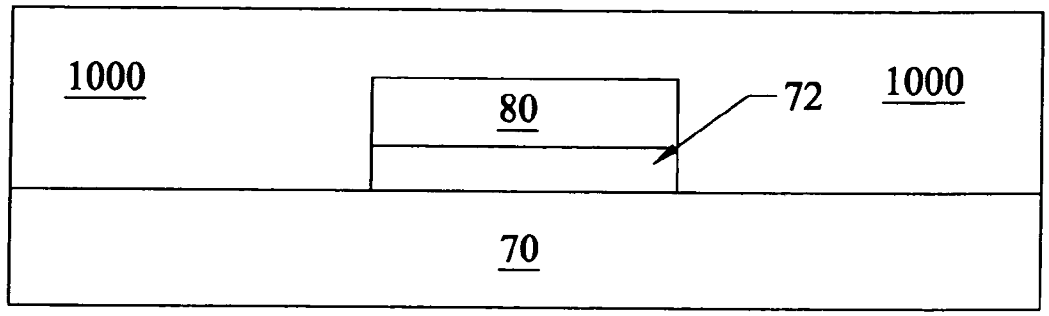
Figure 11:
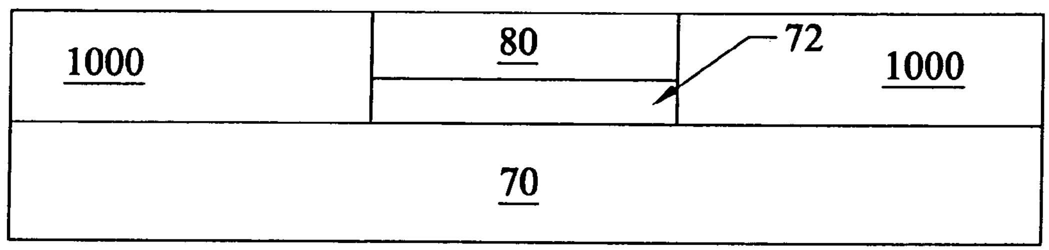
Figure 12:
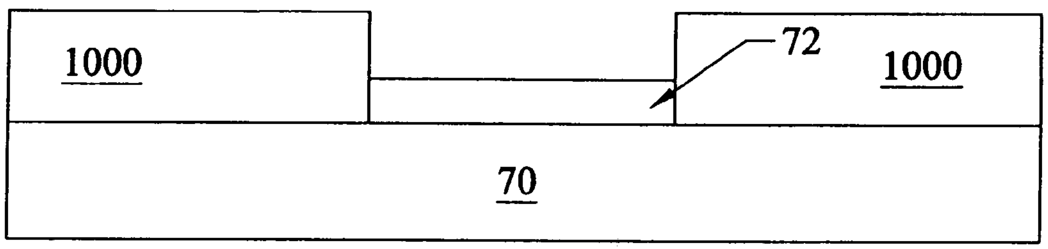

FIGS. 7-12 illustrate a method of forming dielectric and electrode structures according to another aspect of the present invention. A layer of dielectric material 72 (such as BST) is first deposited on a substrate 70 (such as sapphire). A layer of photoresist 80 is then formed on top of those portions of the dielectric layer 72 that are intended to remain. The remainder of the dielectric material (not covered by the photoresist 80) is then etched away using a suitable etchant for the particular dielectric material used. A layer of conductive material 1000 (such as copper) is then deposited on top of the structure (FIG. 10). It should be noted that it is not necessary to remove the photoresist 80 prior to depositing the conductive material 1000. The top of the conductive layer is then removed to smooth or expose the top portion of the photoresist layer 80 to thereby form the distinct electrodes 1000 as shown in FIG. 11. In FIG. 12 the optional step of removing the photoresist 80 is illustrated. It should be understood that the photoresist 80 may be left intact if it does not excessively affect the operation of the device. In fact, the photoresist 80 may add strength to the structure. The main advantage of this method is the reduced number of steps to produce the device or devices. A single masking step is required, by simply etching the electrode material to the level of the mask (photoresist layer 80), unwanted conductive material is removed.

Figure 13:
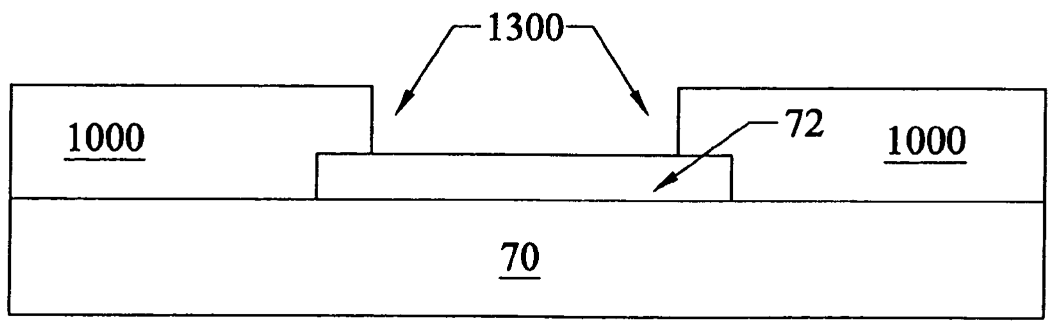
FIG. 13 shows an alternative form of the dielectric and electrode structures of FIGS. 7-12.

FIG. 13 illustrates a further embodiment of an electrode and dielectric structure for use in optic and RF applications. In this device, a portion of the dielectric material 72 extends under the electrodes 1000 as shown at points 1300. By extending the electrodes 1000 over the top of the edges of the dielectric, more of the applied electric field between the electrodes permeates the dielectric, therefore creating a larger change on the dielectric constant/index of refraction in ferroelectric/electrooptic materials. The electrodes are usually 1-5 microns thick with electrode gaps (the portion of the dielectric material 72 exposed between electrodes 1000) usually 0.5-25 microns wide, although other dimensions may yield operational devices. Another advantage of the structures of FIGS. 11, 12 and 13 over prior art devices involves adhesion of the electrodes to the device. In prior art devices, often the dielectric layer completely covers the substrate, and the electrodes are attached on top of the dielectric material. Some conductors (such as copper) have adhesion problems when deposited on top of certain dielectrics (such as BST). By patterning the dielectric, the electrode material is predominately deposited directly onto the substrate, thus the adhesion problems between the conductors and the dielectric layer can be minimized. Some overlap also frees alignment in circuitization without leaving low-k gaps between the conductor and variable capacitance material. Tighter gaps between electrodes can be formed thus reducing the bias voltage required.

A general precursor list (that should not be deemed limiting) for depositing elements by CCVD, includes:

Ag silver nitrate, silver trifluoroacetate, silver acetate, silver cyclohexanebutyrate, silver 2-ethylhexanoate Al aluminum nitrate nonahydrate, aluminum acetylacetonate, triethylaluminum, aluminum sec-butoxide, aluminum iso-propoxide, aluminum bis(2-ethylhexanoate) monohydroxide Au chlorotriethylphosphine gold (I), chlorotriphenylphosphine gold (I)

B trimethylborate, trimethoxyboroxine

Ba barium 2-ethylhexanoate, barium nitrate, barium acetylacetonate hydrate, bis(2,2,6,6-tetramethyl-3,5-heptanedionato)barium hydrate Bi bismuth (III) nitrate pentahydrate, bismuth (III) 2-ethylhexonate Cd cadmium nitrate tetrahydrate, cadmium 2-ethylhexanoate Ce cerium (III) 2-ethylhexanoate Cr chromium (III) nitrate nonahydrate, chromium (III) 2-ethylhexanoate, chromium (III) sulfate hydrate, chromium hexacarbonyl, chromium (III) acetylacetonate Cu copper (II) 2-ethylhexanoate, copper (II) nitrate trihydrate, copper (II) acetylacetonate hydrate Co cobalt naphthenate, dicobalt octacarbonyl, cobalt (II) nitrate hexahydrate Fe iron (III) nitrate nonahydrate, iron (III) acetylacetonate In indium (III) nitrate hydrate, indium (III) acetylacetonate Ir dihydrogen hexachloroiridate (IV) hydrate, iridium (III) acetylacetonate, dodecacarbonyltetrairidium K potassium ethoxide, potassium tert-butoxide, 2,2,6,6-tetramethylheptane-3,5-dionato potassium La lanthanum (III) 2-ethylhexanoate, lanthanum (III) nitrate hexahydrate, lanthanum (III) acetylacetonate hydrate, lanthanum (III) iso-propoxide, tris(2,2,6,6-tetramethyl-3,5-heptanedionato)lanthanum (III)

Li 2,2,6,6-tetramethylheptane-3,5-dionato lithium, lithium ethoxide lithium tert-butoxide Mg magnesium naphthenate, magnesium 2-ethylhexanoate, bis(2,2,6,6-tetramethyl-3,5-heptanedionato)magnesium dihydrate, magnesium acetylacetonate, magnesium nitrate hexahydrate Mo ammonium molybdate tetrahydrate, molybdenum hexacarbonyl, molybdenum (IV) dioxide bis(acetylacetonate)

Na 2,2,6,6-tetramethylheptane-3,5-dionato sodium, sodium ethoxide, sodium tert-butoxide Nb niobium (V) ethoxide, tetrakis(2,2,6,6-tetramethyl-3,5-heptanedionato) niobium (IV), niobium (IV) (2-ethylhexanoate)

Ni nickel (II) nitrate hexahydrate, nickel (II) acetylacetonate, nickel (II) 2-ethylhexanoate, nickel (II) napthenate, nickel carbonyl P triethylphosphate, triethylphosphite, triphenylphosphite Pb lead (II) 2-ethylhexanoate, lead naphthenate, bis(2,2,6,6-tetramethyl-3,5-heptanedionato)lead (II), lead (II) nitrate Pd diamminepalladium (II) nitrite, palladium (II) acetylacetonate, ammonium hexochloropalladate (IV)

Pt platinum (II) acetylacetonate, platinum (II) hexafluoroacetylacetonate, diphenyl(1,5-cyclooctadiene)platinum (II), diammineplatinum (II) nitrite, tetraammineplatinum (II) nitrate Ru ruthenium (III) acetylacetonate Si tetraethoxysilane, tetramethylsilane, disilicic acid, metasilicic acid Sn tin (II) chloride dihydrate, tin (II) 2-ethylhexanoate, tetra-n-butyltin, tetramethyltin Sr strontium nitrate, strontium 2-ethylhexanoate, bis(2,2,6,6-tetramethyl-3,5-heptanedionato)strontium hydrate Ti titanium (IV) iso-propoxide, titanium (IV) acetylacetonate, titanium (di-iso-propoxide)bis(acetylacetonate), titanium (IV) n-butoxide, titanium (IV) 2-ethylhexoxide, titanium (IV) oxide bis(acetylacetonate)

W tungsten hexacarbonyl, tungsten (VI) fluoride, tungstic acid

Y yttrium (III) 2-ethylhexanoate, yttrium (III) nitrate hexahydrate, yttrium (III) iso-propoxide, yttrium (III) napthoate Yb ytterbium (III) nitrate pentahydrate Zn zinc 2-ethylhexanoate, zinc nitrate hexahydrate, zinc acetate Zr zirconium (IV) 2-ethylhexanoate, zirconium (IV) n-butoxide, zirconium (IV) hexafluoroacetylacetonate, zirconium (IV) acetylacetonate, zirconium (IV) n-propoxide, zirconium dinitrate oxide

EXAMPLE 1

Deposition of BST on Sapphire

In this example, $Ba_{0.6}Sr_{0.4}TiO_3$ coatings were deposited onto C-plane Sapphire 250 nanometers thick using the CCVD process. The solution of the $Ba_{0.6}Sr_{0.4}TiO_3$ precursor contained 0.0143 wt % of Sr in the form of strontium 2-ethylhexanoate, 0.0615 wt % of Ba in the form of barium 2-ethylhexanoate, 0.0355 wt % Ti (di-1-propoxide)bis (acetylacetonate), 12.6049 wt % toluene, 0.0118 wt % isoproponal, 1.5333 wt % 1-butanol, and 85.7412 wt % propane. The constant flow rate for the solution was at 2.0 ml/min and for the tip oxygen 4000 ml/min at 80 psi. The gas temperature as measured close to the substrate front surface varied from 900 to 1100° C. BST deposition was epitaxial with 1,1,1 lattice structure.

EXAMPLE 2

Deposition of BST on Sapphire and Device Construction

In this example, $Ba_{0.6}Sr_{0.4}TiO_3$ coatings were deposited onto C-plane Sapphire 377 nanometers thick using the CCVD process. The solution of the $Ba_{0.6}Sr_{0.4}TiO_3$ precursor contained 0.0143 wt % of Sr in the form of strontium 2-ethylhexanoate, 0.0615 wt % of Ba in the form of barium 2-ethylhexanoate, 0.0355 wt % Ti (di-1-propoxide)bis (acetylacetonate), 12.6049 wt % toluene, 0.0118 wt % isoproponal, 1.5333 wt % 1-butanol, and 85.7412 wt % propane. The constant flow rate for the solution was at 3.0 ml/min and for the tip oxygen 4000 ml/min at 80 psi. The gas temperature as measured close to the substrate front surface was 1200° C. Deposition was epitaxial with 1,1,1 lattice structure.

After forming the BST layer, a chromium bond layer and a gold conductive layer were formed on top of the BST using conventional coating methods. The chromium and gold were then patterned to form two electrodes of a 50 finger inter-digital capacitor (similar in structure to layers 22 (sapphire) 24 (BST) and 26 (electrodes) in FIG. 2). The capacitor was tested for its adjustable capacitance by applying a 1 MHz, 50 mV signal between the electrodes while simultaneously applying a DC biasing voltage between the two electrodes.

Figure 5:
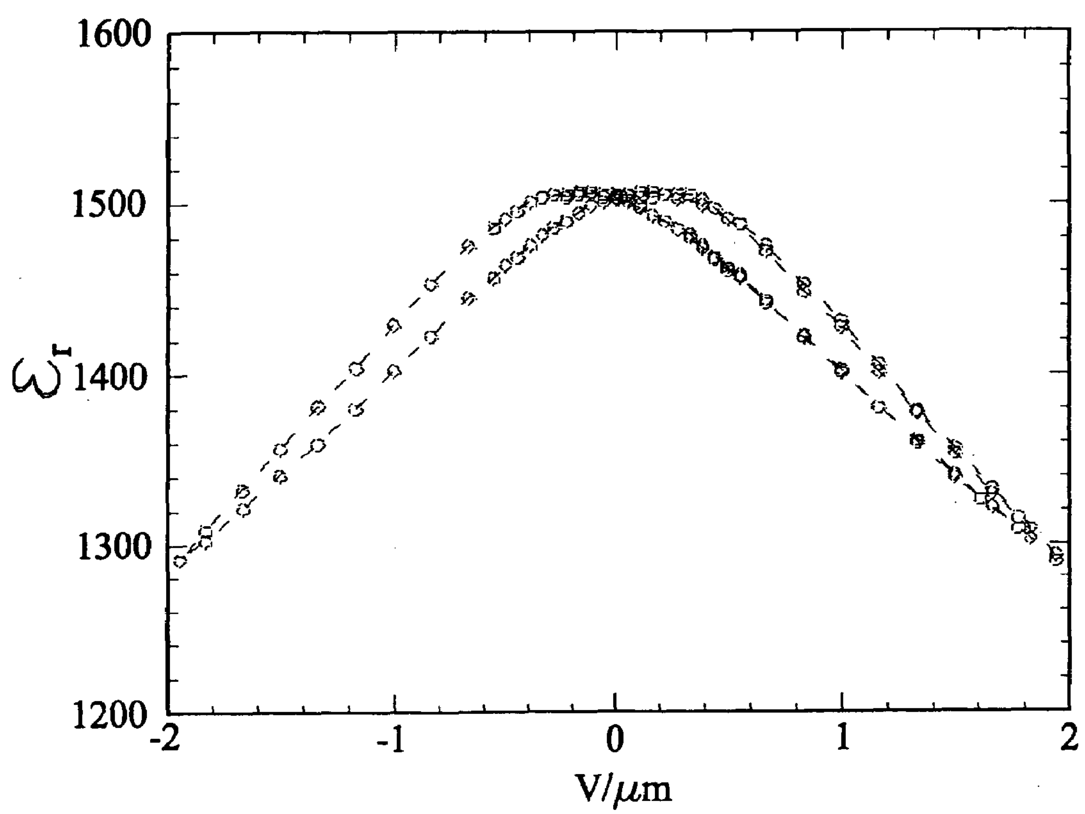
FIG. 5 is a graph showing the change in the relative dielectric constant per applied electric field for a ferroelectric thin film of the present invention.

FIG. 5 shows the change in the relative dielectric constant of the capacitor per applied electric field (note that the two curves are most likely due to hysteresis within the BST). It can be seen that the dielectric constant varies from 1300 to 1500 (about a 13% change) as the applied field is varied from 0-2V/μm. As the capacitance is directly proportional to the dielectric constant, the capacitance would also change by about 13%.

In a separate test to check loss characteristics of the material, a 17.4 GHz signal was applied to a coplanar waveguide phase-shift structure formed from the material. With a biasing voltage of 0VDC, the phase was 468.1°. With a 300VDC biasing voltage, the phase was measured at 427.3°. The worst case loss through the phase shifter was 0.696 dB. The effectiveness (K) of the device was therefore measured as (468.1°−427.3°)/0.696 dB=58.6°/dB. The K of the material is an accurate measurement of the effectiveness of the material in that it describes the amount of phase shift caused by the ferroelectric nature of the material, divided by the signal loss. Of course it should be understood that at least part of the loss is attributed to the finite conductivity of both the patterned conductors and contact resistance that is present in all devices.

EXAMPLE 3

In this example, $Ba_{0.6}Sr_{0.4}TiO_3$ coatings were deposited onto polycrystalline alumina using the CCVD process. Polycrystalline alumina is a less expensive substrate material, but prior art techniques to deposit BST on alumina have resulted in significantly lower performance. By using CCVD, a quality layer was formed. The solution of the $Ba_{0.6}Sr_{0.4}TiO_3$ precursor contained 0.0143 wt % of Sr in the form of strontium 2-ethylhexanoate, 0.0615 wt % of Ba in the form of barium 2-ethylhexanoate, 0.0355 wt % Ti (di-i-propoxide)bis(acetylacetonate), 12.6049 wt % toluene, 0.0118 wt % isopropanol, 1.5333 wt % 1-butanol, and 85.7412 wt % propane. The constant flow rate for the solution was at 5.0 ml/min and for the tip oxygen 4020 ml/min at 30 psi. The gas temperature as measured close to the substrate front surface was 1150° C.

EXAMPLE 4

In this example, indium tin oxide (ITO) coatings were deposited onto sapphire using the CCVD process. The solution of the ITO precursor contained 27.2 grams of (0.1 wt % of In in the form of 0.1 gram of In-acetylacetonate in 27.2 grams of toluene), 3.85 grams of (0.065 wt % of Sn in the form of 0.1 gram of tetramethyl-Sn in 100 grams of toluene), 32.9 grams of toluene and 25 grams of propane. The constant flow rate for the solution was at 3.0 ml/min and for the tip oxygen 4.4 l/min at 80 psi. The gas temperature as measured close to the substrate front surface was 1000-1020° C., and the deposition was continued for 10 minutes. After annealing, the ITO thin film had a resistivity of 48 ohms per square (?/?) and the light transmission through the ITO film and the substrate was 80% of the transmission through the substrate without the ITO film.

EXAMPLE 5

Figure 14:
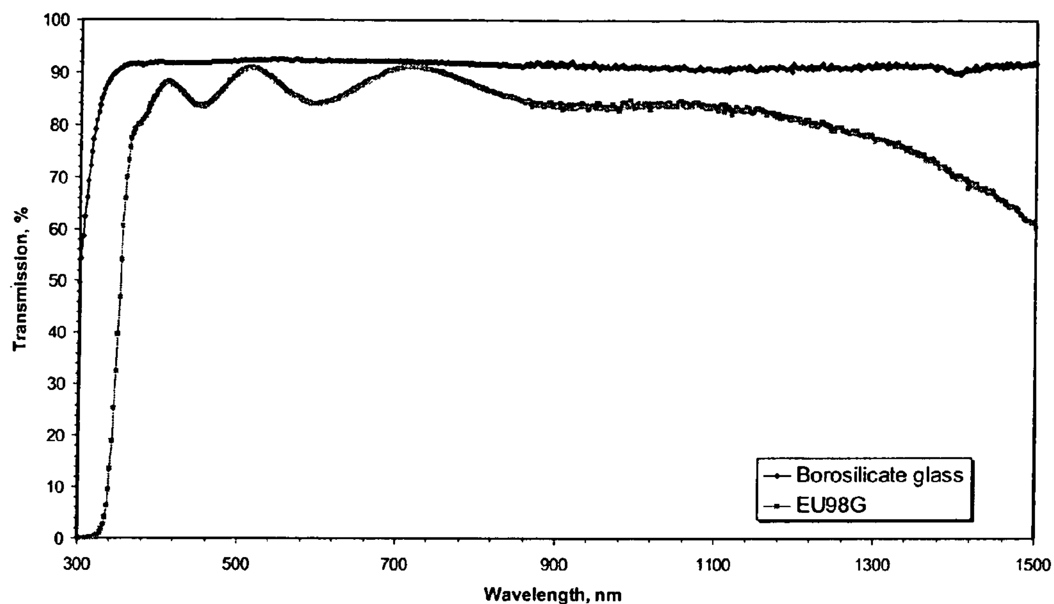
FIG. 14 is a graph of light transmission through a GZO film and a substrate as well as the transmission through the substrate without the GZO film.

In this example, gallium-doped zinc oxide (GZO) coatings were deposited onto borosilicate glass using the CCVD process. The solution of the GZO precursor contained 11.42 grams of Zn-nitrate (5.0 wt % Zn), 3.76 grams of Ga-acac (0.5 wt % Ga), 412 ml of Ethanol, 13.5 ml of dimethyl formamide (DMF) and 9 ml of acetic acid. The constant flow rate for the solution was 3.5 ml/min and for the tip oxygen 0.5 l/min. The gas temperature as measured close to the substrate front surface was 318° C., and the deposition was continued for 26 minutes. After annealing, the GZO thin film was 500 nm thick and had a resistivity of 12 ?/?. FIG. 14 shows a graph of the light transmission through the GZO film and the substrate was as well as the transmission through the substrate without the GZO film. As can be seen the light transmission was 90% or higher for the composite as compared to the substrate alone for wavelengths between 400 and 1200 nm.

EXAMPLE 6

In a CCVD process, a gallium-doped thin film was deposited on borosilicate glass under the following conditions: Precursor solution: 2.31 g zinc 2-ethylhexanoate and 0.88 g gallium acetylacetonate were dissolved in 400 ml of a 20:80 vol:vol toluene/isopropanol solution. During deposition, the substrate temperature was 300° C., the flame temperature 1300° C., motion speed 254 cm. per min, Nozzle temperature 230° C., tip oxygen flow rate, 5 slm. A layer 0.5 micron thick was deposited. The thin film was annealed under a nitrogen atmosphere at 600° C. for 1 hour. Measured sheet resistance was 27 ohms/square.

EXAMPLE 7

In a CCVD process, a gallium-doped thin film was deposited on borosilicate glass under the following conditions: Precursor solution: 1.07 g zinc nitrate and 0.44 g gallium acetylacetonate were dissolved in 200 ml of a 97:3 vol:vol ethanol/n,n-dimethyl formamide solution. The substrate temperature was 300° C.; the flame temperature 1200°; motion speed, 381 cm/min; nozzle temperature 140° C.; and tip oxygen flow rate, 1 slm. A 540 nm thick (0.54 micron) layer was deposited which had a sheet resistance between 12 and 13 ohms per square.

Locally epitaxial or reduced grain boundary high k dielectrics have been deposited from thickness between about 0.1 nm to 10,000 nm depending on the application. More preferably thicknesses for most applications are between 100 and 10,000 nm, between 200 and 3000 nm and in most cases 300 and 1500 nm.

While the invention has been described in terms of certain preferred embodiments, modifications obvious to one with ordinary skill in the art may be made without departing from the scope of the present invention. For example, epitaxial or reduced boundary deposition may be formed on certain polymers, particularly those having surface crystallinity matched to the lattice of the material being deposited thereon.

What is claimed:

1. A variable optical waveguide for modifying an optical signal as it travels through said waveguide, said waveguide comprising:

an electrooptical material portion;

a first biasing electrode within 1 micron of said electrooptical material portion for applying an electric field to said electrooptical material to change the refractive index of the electrooptical material; wherein said first biasing electrode has an index of refraction lower than the index of refraction of said electrooptical material portion and is conductive enough to apply the electric field; and a second biasing electrode of opposite polarity to said first biasing electrode, said second biasing electrode being disposed along the same surface of said waveguide as said first biasing electrode.

2. The variable optical waveguide of claim 1, wherein said first biasing electrode is adjacent said electrooptical material portion.

3. The variable optical waveguide of claim 1, wherein said first biasing electrode is between 200 nm and 0.1 nm thick.

4. The variable optical waveguide of claim 1, wherein said first biasing electrode is between 50 nm and 0.5 nm thick.

5. The variable optical waveguide of claim 1, further comprising a substrate supporting said electrooptical material portion, wherein said first biasing electrode is at least in part between said electrooptical material portion and said substrate.

6. The variable optical waveguide of claim 1, wherein said first biasing electrode is inorganic.

7. The variable optical waveguide of claim 1, wherein said first biasing electrode is an oxide.

8. The variable optical waveguide of claim 1 wherein said first biasing electrode and said second biasing electrode are interdigital relative to each other.

* * * * *